United States Patent [19]

Rasky

[11] Patent Number: 4,802,171
[45] Date of Patent: Jan. 31, 1989

[54] METHOD FOR ERROR CORRECTION IN DIGITALLY ENCODED SPEECH

[75] Inventor: Phillip D. Rasky, Glenview, Ill.
[73] Assignee: Motorola, Inc., Schaumburg, Ill.
[21] Appl. No.: 58,202
[22] Filed: Jun. 4, 1987
[51] Int. Cl.$^4$ .......................... G06F 11/10; G10L 1/00
[52] U.S. Cl. ..................................... 371/43; 371/31; 381/31; 381/46
[58] Field of Search ................. 371/31, 43, 44, 45, 371/65, 37, 39, 40; 381/46

[56] References Cited

U.S. PATENT DOCUMENTS

| | | | |
|---|---|---|---|
| 4,048,443 | 9/1977 | Crochiere et al. | 381/37 |
| 4,054,863 | 10/1977 | Goodman et al. | 371/31 |
| 4,216,354 | 8/1980 | Esteban et al. | 381/31 |
| 4,291,405 | 9/1981 | Jayant et al. | 371/31 |
| 4,375,581 | 3/1983 | Jayant | 375/122 |
| 4,455,649 | 6/1984 | Esteban et al. | 370/80 |
| 4,464,782 | 8/1984 | Beraud et al. | 381/31 |
| 4,622,680 | 11/1986 | Zinser | 375/25 |
| 4,688,224 | 8/1987 | Degan et al. | 371/31 |

OTHER PUBLICATIONS

Aarskog, et al., "Real-Time Implementation of a 16 KBIT/s Speech Coder/Decoder Using Adaptive Sub-Band Coding Together with Time Domain Harmonic Scaling", *Nordic Seminar on Digital Land Mobile Radiocommunication*, (Feb. 5–7, 1985), pp. 27–34.
Ahlin, "Coding Methods for the Mobile Radio Channel", *Nordic Seminar on Digital Land Mobile Radiocommunication*, (Feb. 5–7, 1985), pp. 185–194.
Chien, "Memory Error Control: Beyond Parity", *IEEE Spectrum*, (Jul. 1973), pp. 18–23.
Chu, P., "Quadrature Mirror Filter Design for an Arbitrary Number of Equal Bandwidth Channels", *IEEE Trans. Acoust., Speech, Signal Processing, vol. ASSP-31*, pp. 203–218, Feb. 1985.
Kaltenmeier, et al., "A Subband Coder for Digital Speech Transmission in the Digital Cellular Radio Telephone System CD900", *Nordic Seminar on Digital Land Mobile Radiocommunication*, (Feb. 5–7, 1985), pp. 279–285.
Kittel, "Channel Coding for Digital Public Land Mobile Networks", *Nordic Seminar on Digital Land Mobile Radiocommunication*, (Feb. 5–7, 1985), pp. 57–66.
Max, J., "Quantizing for Minimum Distortion", *IRE Trans, Inform. Theory*, pp. 7–12, Mar., 19a60.
McLaughlin, "Comparison of Sub-Band Coding and Adaptive Predictive Coding for Land Mobile Radio", *Nordic Seminar on Digital Land Mobile Radiocommunication*, (Feb. 5–7, 1985), pp. 115–124.
McLaughlin et al., "Speech and Channel Coding for Digital Land-Mobile Radio", *IEEE Journal on Selected Areas in Communications*, vol. 6, No. 2, (Feb. 1988), pp. 332–345.
McNamara, John E., *Technical Aspects of Data Communications*, 2nd ed. (Bedford, MA: Digital Press, 1982), pp. 110–112.

*Primary Examiner*—Charles E. Atkinson
*Attorney, Agent, or Firm*—Douglas A. Boehm; Charles L. Warren

[57] ABSTRACT

A system and method for error correction in communication systems for transmission of digitized speech signals. Sub-band coding is preferably applied to the input signal, and the sample information and the side information provided. An error detection code (EDC) is applied to at least a portion of the side information and an error correction code (ECC) is applied over the side information and the EDC. A second EDC is applied to the ECC. These information signals and error detection and correction codes are multiplexed with the protected portion of the side information and the error correction code separated by at least the sample information. Speech signals are thus transmitted and reconstituted with improved quality with a minimum data rate required.

13 Claims, 2 Drawing Sheets

METHOD FOR ERROR CORRECTION IN DIGITALLY ENCODED SPEECH

CROSS REFERENCE

This invention is related to another invention disclosed in U.S. patent application, Ser. No. 058,201, assigned to the same assignee and filed as of even date herewith.

BACKGROUND OF THE INVENTION

The present invention is related to the field of speech communication and particularly to means for providing improved detection and correction of errors due to noise, fading etc. during transmission without increasing the required bit rate.

In the field of digital communications, such as mobile and portable two-way communications, there are a number of possible channel conditions which adversely affect the quality of transmission. These include fading from shadowing, multipath reception, Doppler due to motion of a vehicle and other causes of signal strength variation. Under conditions of heavy channel utilization with low data bit rates, it becomes particularly important to combine essentially error-free decoding with the minimum required number of bits per unit of information.

When digital data is being transmitted, as from one computer to another, the most common way of dealing with erroneous signals is to resend the original signal. In other words, data signals are not in real time, therefore, if an error or errors are detected in a received signal, a return signal can be sent to the transmitting unit requesting a retransmission of the data. In the case of speech signals, which exist in real time, no such method can be utilized. It is necessary to include with the information necessary for decoding the speech information sufficient added information so that the receiving unit can detect any errors, and do the best possible job of correcting those errors, all while a user is perceiving the output speech signals.

Since there is little possibility of reducing the incidence of channel impairments, many methods of correcting errors have been developed in the field. In the Sub-Band Coding system with which the present invention would preferably operate, speech signals are encoded in frames, typically 20 to 30 msec in length, including two main kinds of information, the sample information and the side information necessary for proper decoding of the sample information. Certain of these bits have been found to be more susceptible to errors in transmission than others. It is these more vulnerable bits which have been the subject of various error control efforts with varying degrees of success. In the patent application cross-referenced above, the side information relative to each channel has been divided into the most-significant-bits (MSB) and the least-significant-bits (LSB) with the MSB protected and utilized in a manner which improves the "robustness" of the transmission.

Other systems have utilized various coding schemes in the effort to make the systems more robust. In a paper given by Ekemark, Ralth and Stjernvall at the Nordic Seminar on Digital Land Mobile Radiocommunications Feb. 5-7, 1985, at Espoo, Finland, "Modulation and Channel Coding in Digital Mobile Telephony", rather complicated calculations are shown for a high performance modulation system which is said to be well suited to operation under the conditions of Rayleigh fading and co-channel interference which exist in the mobile telephone environment. While little if anything is gained by the modulation system of this article in a stationary environment, the main disadvantage of the system is the high overhead requirement. There is still a need for a method of improving the accuracy of decoded speech by encoding which prevents most of the errors introduced during transmission from affecting the resultant quality of the decoded speech signals. It is not particularly difficult to do any of these things if there are sufficient bits available for "protection". The complicated task is to protect the signal to a high degree of accuracy with a minimum of added bits.

SUMMARY OF THE INVENTION

The object of the present invention is to minimize loss of speech quality and intelligibility due to errors introduced into the channel during transmission.

A particular object is to maintain acceptable speech quality without exceeding the allowed bit rate.

These objects and others are accomplished in a system using a unique combination of time diversity, error detection coding and error correction coding with means for elminiating those errors which prove to be essentially non-correctable. The elements of the method are provided in conformity with the known conditions of the environment and the characteristics of speech signals. Thus, for example, the process of error correction is in keeping with the known characteristics of the noise-introduced errors. Likewise, the separation in time of the time diversity is calculated from the likelihood of a given range of a fade period.

The present invention is a system and method for error correction in communication systems for transmission of digitized speech signals Sub-band coding is preferably applied to the input signal, and the sample information and the side information provided. An error detection code (EDC) is applied to at least a portion of the side information and an error correction code (ECC) is applied over the side information and the EDC. A second EDC is applied to the ECC. These information signals and error detection and correction codes are multiplexed with the protected portion of the side information and the error correction code separated by at least the sample information. Speech signals are thus transmitted and reconstituted with improved quality with a minimum data rate required.

DETAILED DESCRIPTION OF THE PREFERRED EMBODIMENT

Before describing the details of the method of the invention, it may be instructive to review the characteristics of the channel impairments which the invention corrects or alleviates. The most severe or these impairments is caused by fading in the presence of co-channel interference. Very weak signals may include static errors which can be of single bit duration. Bursts of noise such as automobile ignition can cause errors of several bits duration. Additional errors may be due to the channel characteristics of the telephone network itself, with bursts of noise from 1 to 7 bits in length.

As may be seen in the above-referenced application, the number of bits of side information which are most sensitive to error can be reduced to a relatively short block (35 bits in the exemplary system disclosed therein). It can be shown that such a block is in the order of a fade length period at transmission rates of 10–16 kbps. It makes sense to treat this information as a single entity since a fade is likely to affect all or most of the bits of such a block and the information of the block is not useful unless it is recoverable completely error-free. Time diversity is used in the present method in such a manner as to separate in time the transmission of the block of redundancy bits from the protected information bits by the length of the block of bits of the sample information. A cyclic redundancy check (CRC) is appended to both the sample information and the redundancy blocks. Instead of using a simple repetition of the information block as the redundancy, the redundancy provided by an error-correcting code (ECC) is used.

Figure 1:
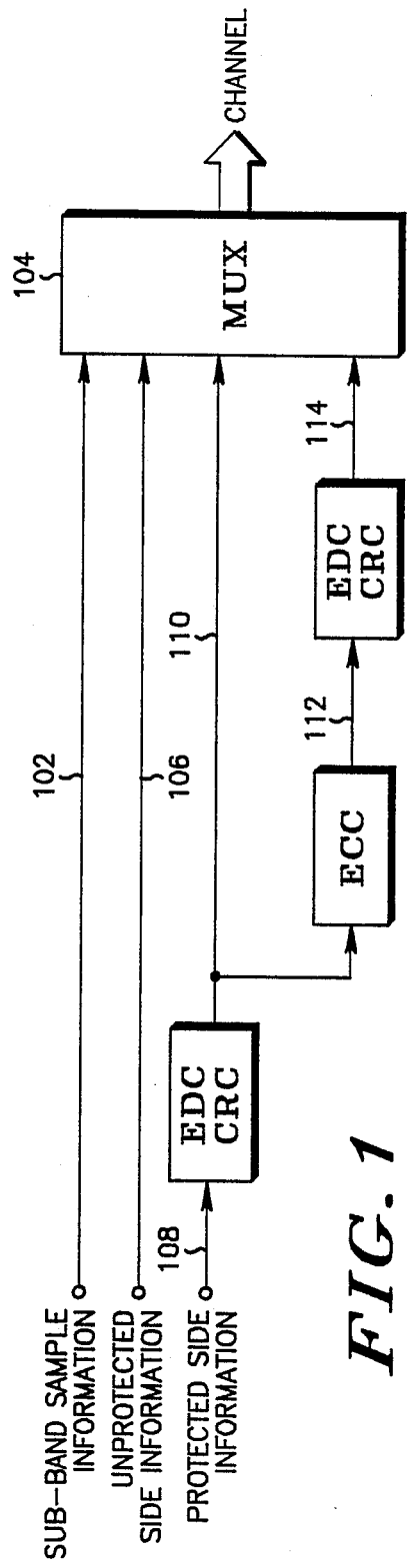
FIG. 1 is a block diagram illustrating the formation of the error-control coding of the invention.

Referring no more specifically to FIG. 1, the generation of the error control coding may be seen. As mentioned, the exemplary environment of sub-band coding is shown for clarity although not necessary to the invention. Therefore, the line 102 represents the sampling, quantizing and filtering of the input speech signals which are then coupled to a multiplexer 104, the output of which goes to a "channel" representing whatever transmission method is being utilized. As is known in the art of sub-band coding, the energy of the filtered bands is partially coded as "side information" and these bits are also necessary for the decoding of the sample information. In the environment of this particularly system the bits of side information are divided into the MSB, i.e., those found to be most critical for proper decoding, and the LSB, the remainder of the bits. Also coupled to the multiplexer is a line 106, representing the less significant bits of side information which are transmitted with no protection.

A third line 108 represents the most-significant-bits (MBS) of "side information" from which the bit allocations of the sub-bands are derived (in both transmitting and receiving units). Added to the actual bits of side information are a small number of error detection code bits (EDC). These bits are a cyclic redundancy check (CRC) and the combination is coupled to the multiplexer via line 110. The MSB and EDC are also provided with an error correcting code (ECC) as at 112 and a corresponding cyclic redundancy check (EDC) is appended as at 114. The above described signals are then multiplexed into frames as shown in FIG. 2.

Figure 2:
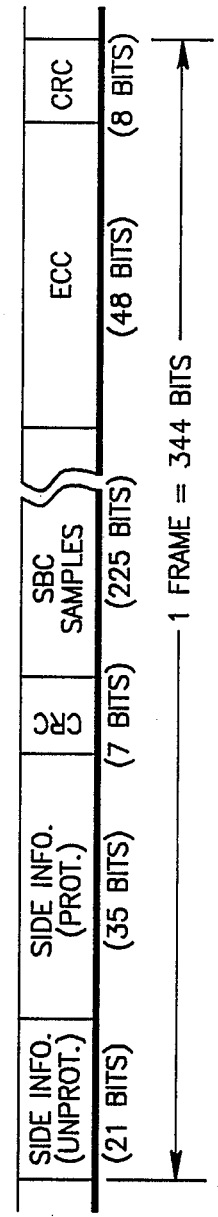
FIG. 2 is a chart of the resultant bit stream of the coded signal.

The exemplary frame of FIG. 2 includes 344 bits although the specific numbers of bits shown in the figure should not be considered as limiting the invention in any way. The LSB, or bits of side information which are not to be protected since they are the least critical information to be transmitted, are placed first, the position most exposed to errors. Next are the MSB of the side information, followed by the 7 corresponding bits of the error detecting code of CRC. Following the 225 bits of sample information is the error correcting code or ECC for the MSB, the protected bits of side information, then the error detecting code or CRC for the redundancy bits.

The type of error correcting code is chosen to serve the dual purpose of redundancy and error correction when both the protected bits and the redundancy bits have been "corrupted" by errors during transmission. This requires that the code be invertible so that the information can be entirely recovered fom the redundancy bits. The preferred code is a (2, 1) convolutional code which may be threshold decoded within a microcomputer. The code has a memory of M=5, an effective constraint length of 11 and an actual constraint length og 12. The redundancy for the code may be generated by bit serial multiplication of the information by the following polynomial:

$$G(D) = 1 + D^3 + D^4 + D^5$$

This code can correct 2 errors in a sliding window of 11 bits.

A logical extension of these techniques would involve the user of a (3,1) convolutional code. In this modification, three independent representations of one frame's protected side information bits would be separated across three frame intervals, thus giving stronger redundancy against fading.

In addition, the information block and the redundant block are each interleaved to the fullest capability so that consecutive errors are not decoded within any single actual constraint length. Usually, interleaving of convolutional codes involves interleaving in blocks where information and redundancy bits alternate in location. This technique cannot be used in the present system since the information bits and redundancy bits have been separated to protect against errors due to signal fading. The equivalent burst-correcting capability can be achieved by independently interleaving the side information bits and the redundancy bits. The optimum interleaving is provided by 6×7 interleaving of the protected bits of the side information and a 6×8 interleaving of the redundancy bits (ECC). Since it is not desirable for the order of the side information bits to be altered, the preferred technique is to presume that the protected bits of side information are already in interleaved order. Those bits are then essentially 6×7 de-interleaved before the convolutional code is generated over the bits. Such interleaving permits correction of error bursts of up to 14 bits in length to be corrected, or any two error bursts of seven bits in length. Inversion of the redundancy is accomplished by bit serial division by G(D).

Figure 3:
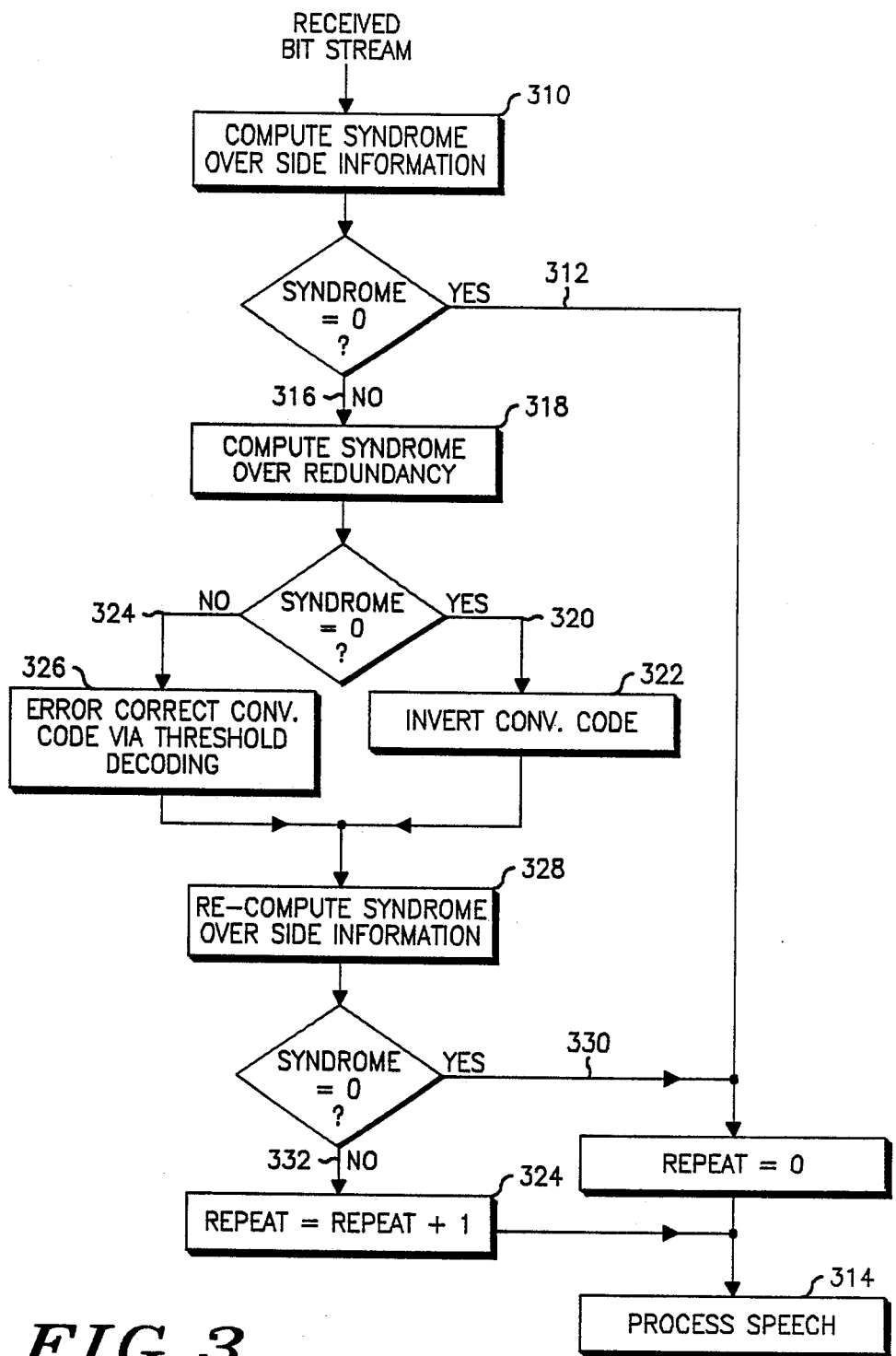
FIG. 3 is a flow chart illustrating the method of decoding the transmitted and received signal.

FIG. 3 is a flow chart illustrating the decoding algorithm used in the receiver for the error-control data. First, the decoder attempts to detect errors (310) over the information block by calculating the syndrome over the CRC. If no errors are detected (312), the information block is assumed to be error-free, and the speech coder proceeds to synthesize speech (314) for that frame. If errors have been detected in the information block (316), the redundant block is checked for errors (318), using the corresponding CRC. If no errors are detected (320) in the redundancy block, the information block is discarded, the redundancy is deinterleaved (step not shown) and the inverse is taken (322) to yield the transmitted information block.

If, however, errors are detected in the redundancy (324), the redundancy is de-interleaved and combined with the information block for threshold decoding (326). After either of these correction processes (322) or (326), the CRC over the "corrected" data is recomputed (328) as a check to ensure that there has been no decoding failure. This last computation is made possible by the provision of forward-error-correction (FEC) coding over the CRC of the information block. With the addition of the final FEC check the system has become highly robust to false decoding. If the correction has been successful (330), the speech synthesis proceeds (314). If correction has not been successful (332), the error-containing frame is deleted and a previous correct frame is substituted. Since the last previous frame may not have been correct either, a counter of consecutive deleted frames is updated (324). When inserted in place of the incorrect one. Subsequent deleted frames result in muted audio which is highly preferable to synthesizing potentially noisy speech frames.

Thus there has been shown and described a method for error correction in a communicative system for digitally encoded speech. The improvement derives from a unique combination of error detection steps, forward error correction, time diversity and a final error detection step which, in the event of still-uncorrected errors, substitutes a previous error-free signal. These steps provide decoded and synthesized speech quality with minimized disturbance form noise during transmission. This invention is applicable to use with other forms of speech coding, especially those which are forward adaptive such as Adaptive Predictive Coding, Residual Excited LPC and Multi-Pulse LPC, for example. Other variations and modifications of this improvement are possible and it is intended to cover all such as fall within the scope of the appended claims.

What is claimed is:

1. A progressive method of decoding a transmitted, digitally encoded speech signal and correcting errors introduced during transmission, the method comprising the following steps:
   (a) receiving said transmitted signal and providing therefrom a frame of data bits having at least a first block of information bits and an additionally coded version of said first block of information bits;
   (b) computing a first error syndrome over said first block of information bits;
   (c) if said first syndrome indicates no error present in said first block of bits, utilizing said bits for speech synthesis;
   (d) if said first syndrome indicates error present in said first block of bits, computing a second error syndrome over said additionally coded version of said first block of bits;
   (e) if said second syndrome indicates no error present in said additionally coded bits, utilizing said additionally coded bits for speech synthesis;
   (f) if said second syndrome indicates error present in said additionally coded bits, combining said additionally coded bits with said first block of information bits for error correction;
   (g) computing a third syndrome over the correct bits resulting from steps (e) or (f);
   (h) if said thrid syndrome indicates no error present in said resultant bits, utilizing said resultant bits for speech synthesis.

2. The method of claim 1 and further including the steps of:
   if said third syndrome indicates error is present in said resultant bits, deleting the frame including said resultant bits, and utilizing the most recent frame containing no errors for speech synthesis.

3. The method of claim 1 and further including the step of:
   if said third syndrome indicates error is present in said resultant bits, muting erroneous and noncorrectable frames containing said resultant bits.

4. The method of claim 1 wherein the coding or said additionally coded versin of said first block of bits comprises a convlutional coding of said bits from which the information bits can be completely recovered if no errors are present in said bits.

5. The method of claim 1 wherein said digitally encoded speech signal is a sub-band coded signal having sample information and side information and is produced by at least the following steps:
   providing said first block of bits form a first portion of the side information from said speech signal;
   providing a second block of bits form the sample information from said speech signal;
   providing a third block of bits from a second portion of the side information from said speech signal;
   providing a fourth block of bits from an error detecting code for said first block of bits;
   providing a fifth block of bits from an error correcting code for said side information first portain and said error detecting code;
   providing a sixth block of bits from a second error detecting code for said error correcting code; and
   multiplexing said blocks of bits for transmission on a transmission channel.

6. The method of claim 5 wherein said error correcting code is a convolutional code having a rate not greater than one-half.

7. The method of claim 5 wherein said error correcting code is a convolutional code having a rate not greater than one-third.

8. The method of claim 5 further including the step of providing a seventh block which is a different additionally coded version of said first block.

9. The method of claim 5 and wherein the multiplexing step includes separating said first and fourth blocks from the fifth and sixth blocks by at least the length of the second block.

10. The method of claim 5 and wherein the multiplexing step includes independently interleaving said first and fifth blocks of bits.

11. A system for providing error correction for digitally encoded speech signals having sample information and side information and comprising:
   first coding means for providing a first error detecting code for at least a portion of said side information;
   second coding means for providing an error correcting code for said portion of side information and said first error detecting code;
   third coding means for providing a second error detecting code for said error correcting code; and
   multiplexing means for combining said sample information, said side information, and said error detecting and correcting codes and outputting said combined signals to a channel for transmission.

12. The system according to claim 11 and wherein said sample information and said side information are produced by sub-band coding.

13. The system according to claim 11 and wherein the multiplexing means includes means for separating said portion of side information from said error correcting code by at least one-half the length of said sample information.

* * * * *

UNITED STATES PATENT AND TRADEMARK OFFICE
CERTIFICATE OF CORRECTION

PATENT NO. : 4,802,171
DATED : Jan. 31, 1989
INVENTOR(S) : Phillip D. Rasky

It is certified that error appears in the above-identified patent and that said Letters Patent is hereby corrected as shown below:

Col. 6, Line 5: Delete "versin" and insert --version--.

Col. 6, line 6: Delete "convlutional" and insert --convolutional--.

Signed and Sealed this

Ninth Day of January, 1990

Attest:

JEFFREY M. SAMUELS

Attesting Officer        Acting Commissioner of Patents and Trademarks